(12) United States Patent
Keyser et al.

(10) Patent No.: US 7,867,023 B2
(45) Date of Patent: Jan. 11, 2011

(54) ELECTRICAL CONNECTOR HAVING POSITIONING PEG AND ASSEMBLY HAVING SAME

(75) Inventors: Frank Keyser, Elk Grove Village, IL (US); Robert M. Fuerst, West Bloomfield, MI (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/420,621

(22) Filed: Apr. 8, 2009

(65) Prior Publication Data

US 2009/0258543 A1 Oct. 15, 2009

Related U.S. Application Data

(60) Provisional application No. 61/123,328, filed on Apr. 8, 2008.

(51) Int. Cl.
*H01R 13/60* (2006.01)
(52) U.S. Cl. ..................................................... 439/567
(58) Field of Classification Search ................. 439/677, 439/374, 378, 375, 680, 567, 571
See application file for complete search history.

(56) References Cited

U.S. PATENT DOCUMENTS

| | | | | |
|---|---|---|---|---|
| 5,147,225 A | * | 9/1992 | Kile et al. | 439/680 |
| 6,411,526 B1 | * | 6/2002 | Nguyen et al. | 361/829 |
| 6,592,401 B1 | * | 7/2003 | Gardner et al. | 439/544 |
| 6,966,795 B2 | * | 11/2005 | Xu | 439/571 |
| 2010/0068925 A1 | * | 3/2010 | Daily | 439/567 |

\* cited by examiner

*Primary Examiner*—Ross N Gushi
(74) *Attorney, Agent, or Firm*—Larry I. Golden

(57) ABSTRACT

The present disclosure relates to electrical connectors and to header systems having such connectors. In one embodiment an electrical connector also known as a header can have two aligning and locating pegs for cooperating with alignment holes of the housing of a control module to accurately and precisely position header in a respective bay of the control module. The pegs of each header can have either unique cross-sectional shapes which can be reflected in respective alignment holes of housing, or can be uniquely positioned on the header which positioning is matched on the holes of the housing to permit each header to be accurately and precisely seated along the x-axis and the y-axis in only one bay and in only a desired front back orientation, or both. In this fashion, the terminals of the header, including its pins, are in position to engage openings in a PCB or other connector. The pegs can also include ribs to capture the housing and prevent vertical or z-axis movement of the header relative to the housing. Retaining the desired vertical position can result in precise placement of the terminals along the z-axis for engagement with respective PCB. Each header can include a trough system to receive overflow of adhesive used to secure the header to the housing.

10 Claims, 7 Drawing Sheets

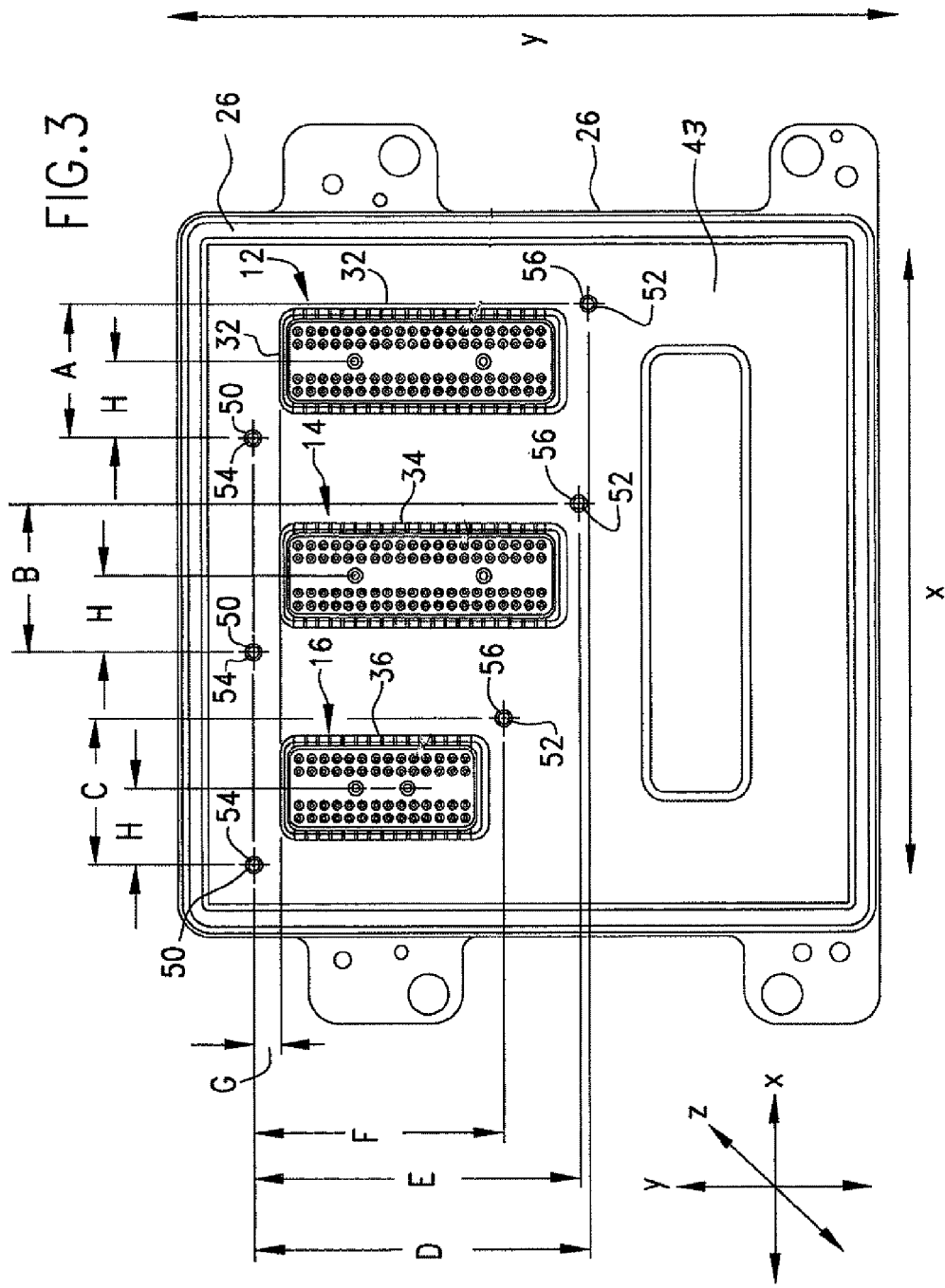

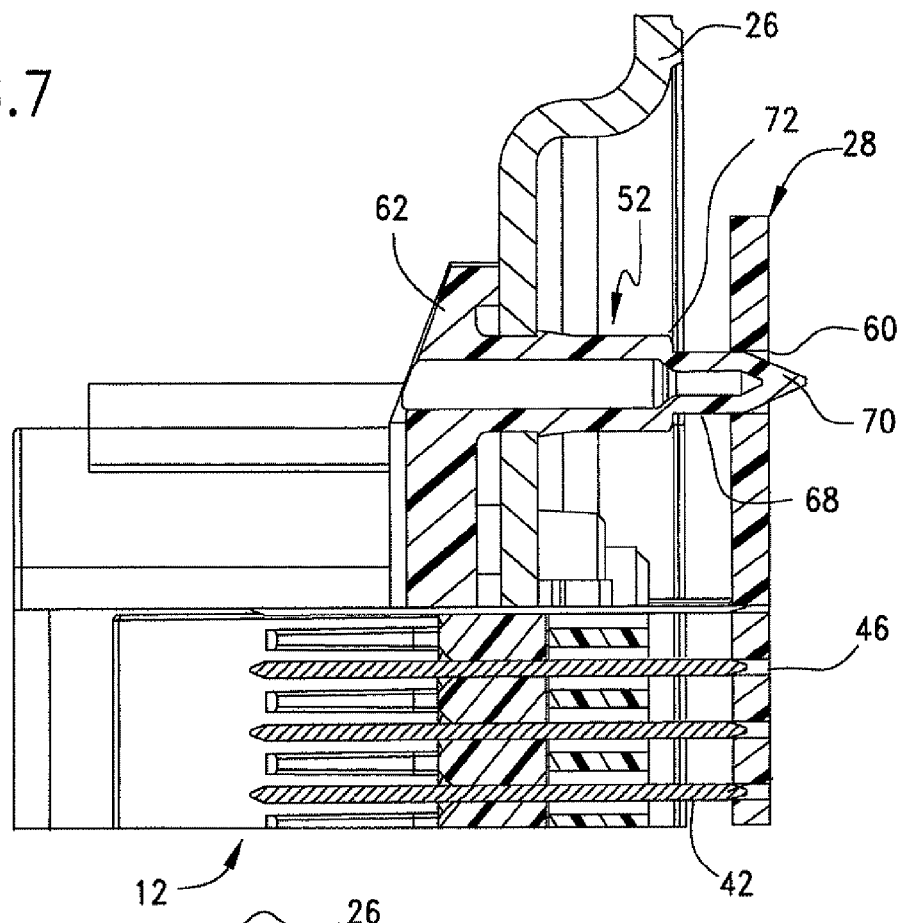
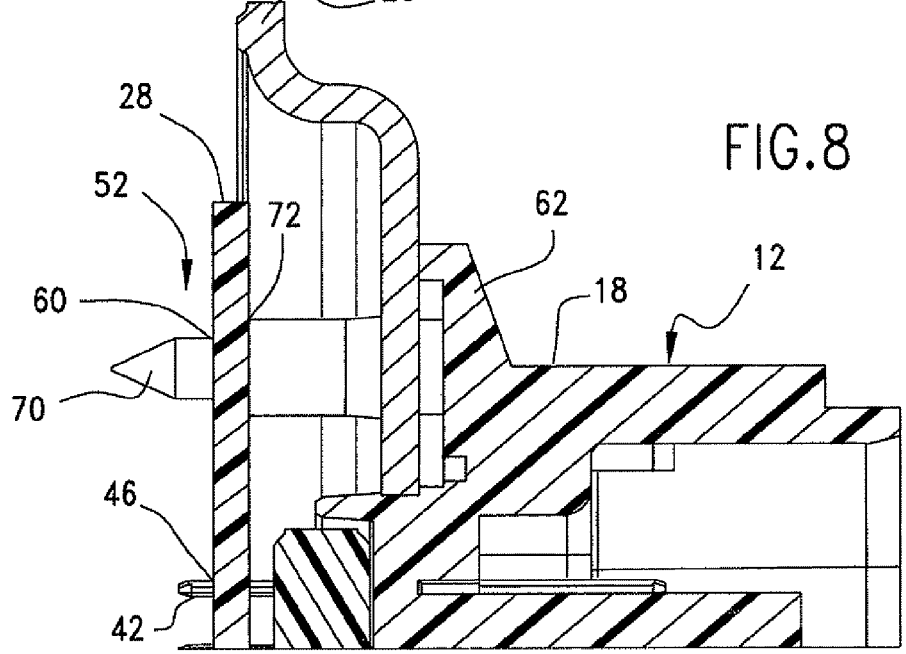

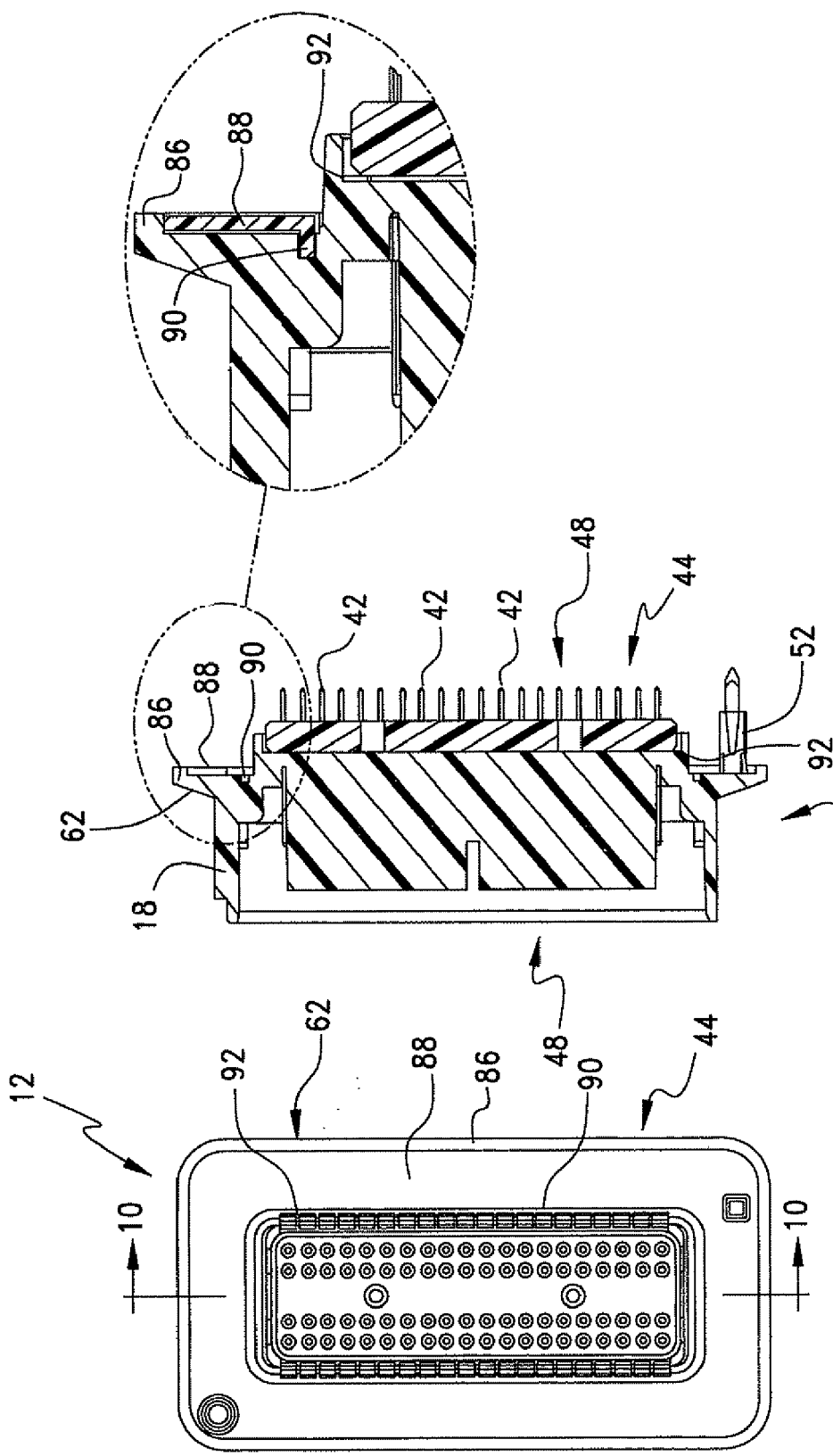

ELECTRICAL CONNECTOR HAVING POSITIONING PEG AND ASSEMBLY HAVING SAME

This application claims priority to U.S. Provisional Application Ser. No. 61/123,328 filed on Apr. 8, 2008, which is incorporated herein by reference in its entirety,

TECHNICAL FIELD

The present disclosure relates to electrical connectors and to control modules having such connectors. More particularly, the present disclosure relates to a shroud of a connector having one or more locating peg(s) for precise and accurate placement of the connector to the housing of a control module and a control module having such a connector.

BACKGROUND

Generally, an electrical connector includes some form of dielectric housing that mounts a plurality of conductive terminals for making electrical connection with the terminals of a complementary mating connector and/or other connecting devices such as to the circuit traces on a printed circuit board, flat flexible cable or the like. Many connectors are shielded or filtered to protect against interference with the electrical signals carried by the terminals.

Unfortunately, existing connectors and the modules including such connectors are costly to produce and require significant capital investment for automated assembly and fixturing. Precision carriers are required to enable accurate alignment of the connectors to the module, which represent a significant portion of the total tooling cost. Additionally, the module must be cured at a very high temperature, which potentially results in decreased reliability and shortened part-life.

Typical die cast modules have one or more electrical connectors also known as headers which include a dielectric shroud having wire contacts that require soldering to connect the contacts to the printed circuit board (PCB). Soldering is expensive, has the potential for being associated with environmental hazards and is prone to cracking over time. Compliant pin contacts require a straightforward press-fit or interference connection with the PCB eliminating the disadvantages of the soldering process. Including compliant pin contacts on die cast modules has not been commercially feasible. One difficulty that the present approach has recognized and addressed is the difficulty of accurate and precise placement of the headers to the stamped or die cast housing because variations in the molded shroud and the tight tolerance between terminals and PCB holes prevents the precise and accurate placement of the straight end or compliant pin end terminals needed to achieve proper mating of the terminal ends to a PCB or other electrical component. Precise placement is required because the PCB connection tip of the terminals, whether compliant pin ends or straight ends must be centered in the PCB upon mounting of the PCB to the housing. The relative tight tolerances required in precisely placing pin terminals for mating to a PCB have made integrating terminal pin connectors to a control module housing challenging.

The present disclosure provides an approach by which electrical connectors having terminals with either straight ends or compliant pin ends can be mounted accurately and precisely on a consistent basis such that the terminal ends are positioned to properly engage a PCB or other connection. In other words, the present approach provides precise and accurate positioning of the straight or compliant pins of the header in the x-axis, y-axis and z-axis. The present disclosure minimizes stack-up tolerances between PCB and header which were encountered in systems utilizing precision carriers. The present disclosure also provides an approach by which overflow of adhesive used to secure the electrical connector to the control module housing can be captured.

SUMMARY

In one aspect of the present disclosure an electrical connector is provided for mounting on a housing having a plurality of mounting bays for receiving the electrical connectors. Each mounting bay has at least one unique positioning hole associated therewith. The connector includes a dielectric housing supporting a plurality of terminal pins and at least one unique positioning peg adapted for mating with only one of said at least one unique positioning hole wherein the mating of the unique positioning peg with only one of the at least one unique positioning hole ensures mounting of the electrical connector in only a predetermined one of the plurality of mounting bays.

In another aspect of the present disclosure a header system is provided. The system header includes a system housing that has two or more mounting bays for receiving an electrical connector and one of a unique positioning peg and a unique positioning hole associated with each of the mounting bays. The header system also includes two or more electrical connectors. Each electrical connector includes a dielectric housing having the other of the unique positioning peg and the unique positioning hole, wherein the mating of the unique positioning peg and the unique positioning hole cooperate for mounting each of the two or more electrical connectors to an exclusive one of the two or more mounting bays. This header system further includes a trough formed in each header to receive overflow of adhesive used to secure the header to the housing.

In yet another aspect of the present disclosure there is provided method of assembling a header system. The method includes providing a system housing that has multiple bay openings and a unique positioning hole associated with each bay opening Providing multiple electrical connectors, each electrical connector has a unique positioning peg for mating exclusively with one of the unique positioning holes. Inserting the unique positioning peg of each electrical connector through its associated unique positioning hole until a rib of each positioning peg engages the associated unique positioning hole to prevent removal of the positioning peg.

BRIEF DESCRIPTION OF THE DRAWINGS

In the following detailed description, reference will frequently be made to the following views of the drawing, in which like reference numerals refer to like components, and in which:

FIG. 3 is an elevation view of header system according to the present disclosure.

FIG. 7 is a cross-sectional view of an alignment peg and terminal pins according to the present disclosure engaging a PCB prior to full engagement, which can be referred to as a pre-loaded position.

FIG. 8 is a cross-sectional view of an alignment peg and terminal pins according tot the present disclosure fully engaged to a PCB, which can be referred to as the fully-assembled position.

FIG. 9 is an elevation view of one embodiment of a header according to the present disclosure.

FIG. 10 is a cross-sectional view taken at line 10-10 of the header shown in FIG. 9.

DETAILED DESCRIPTION

As required, detailed embodiments are disclosed herein; however, it is to be understood that the disclosed embodiments are merely exemplary of present approach, which may be embodied in various forms. Therefore, specific details disclosed herein are not to be interpreted as limiting, but merely as a basis for the claims and as a representative basis for teaching one skilled in the art to variously employ the present approach in virtually any appropriate manner.

In order to address the need for accurate and precise positioning and alignment of terminal pins, whether straight or compliant, for connection to a PCB or other electrical component, the following approach is provided. A flanged shroud is formed with one or more alignment and locating pegs, with two pegs shown in the illustrated embodiment where the pegs engage corresponding holes on a housing of a control module. The pegs lock into the housing and locate a printed circuit board (PCB) before the terminal pins housed in the molded shroud of the connectors engage the respective openings of the PCB. A particular advantage of this type of a system is that the cooperation between pegs and datum holes in the housing of the control module and PCB provides accurate x-y-z axis alignment and location, i.e. left-right, front-back, up-down, respectively of the terminal pins, which in the following embodiments can be compliant pins, of one or more connectors.

Figure 1:
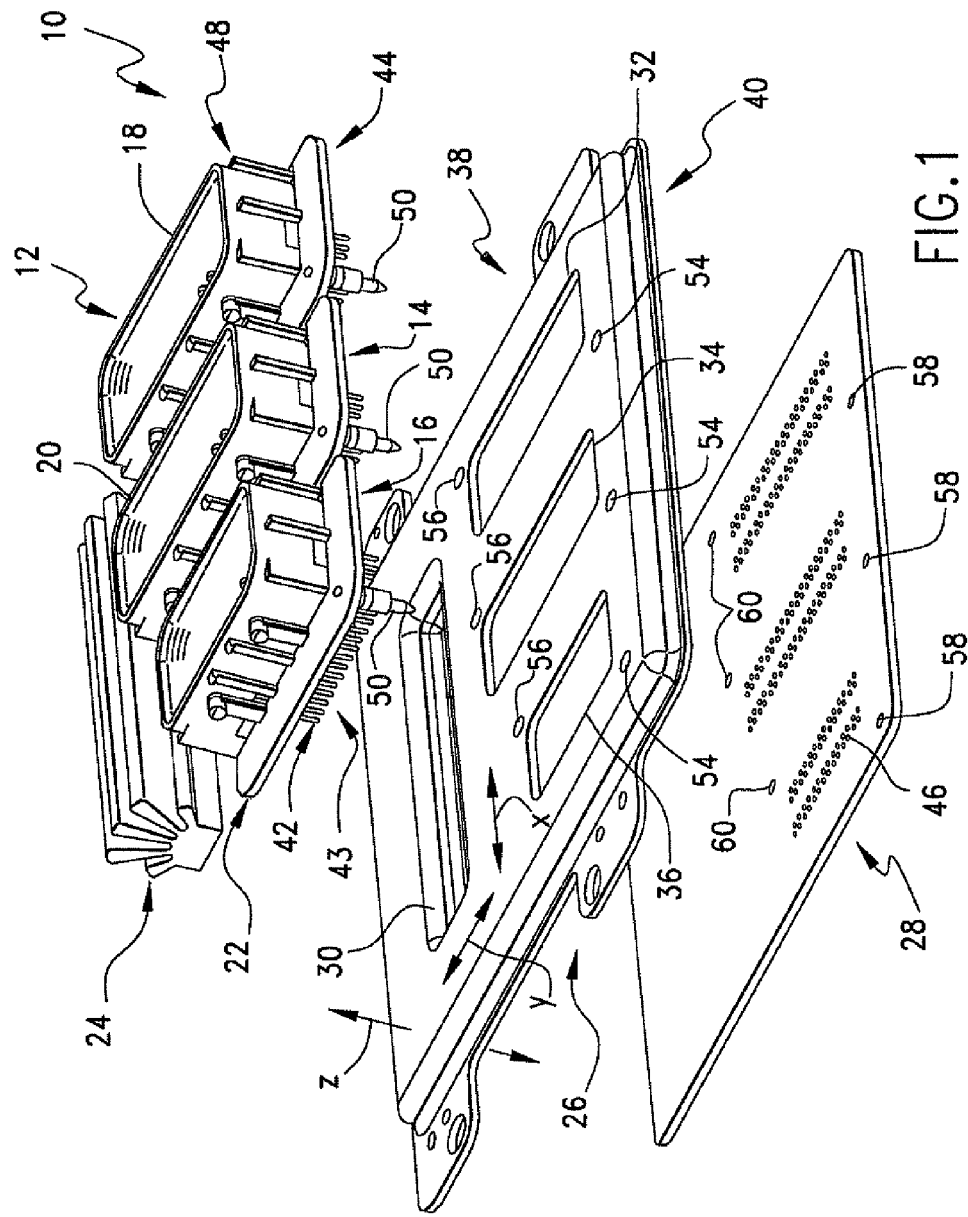
FIG. 1 is an exploded perspective view showing one embodiment of a header system according to the present disclosure and a PCB.

Turning now to FIG. 1, there is shown an exploded view of one embodiment of a header system 10 also known as a control module. In accordance with the present disclosure, system 10 can include one or more headers 12, 14, 16, each having a housing known as a shroud 18, 20, 22 respectively. Shrouds 18, 20, 22 can be typically made by molding of any suitable dielectric material such as plastic or plastic alloys for example Ticona PBT 3309HR or a like material. Header system 10 can also include one or more heat sinks 24 and housing 26.

System 10 can have housing 26 which can include one or more bay openings 30, 32, 34, 36 for mounting heat sink 24 and headers 12, 14, 16, respectively. Housing 26 can have a top end 38 against which headers 12, 14, 16 can be seated and a bottom end 40 against which PCB 28 can be seated. Housing 26 can be made of a variety of materials. In the illustrated embodiment housing 26 is made from a stamped aluminum material.

Each header 12, 14, 16 can fit into the stamped housing 26. Shrouds 18, 20, 22 can support a plurality of terminals 43. Terminals 43 can have one end for contacting terminals of a mating connector, which can be referred to as the connection side and compliant pin ends or straight pin ends 42 for engaging a PCB or other connector component, the pins extending outward from the opposing side, which can be referred to as the mating side. Pin ends 42 of header terminals 43 can extend from the bottom of PCB mating side 44 of headers 12, 14, 16 and can engage corresponding openings 46 in PCB 28. The ends (not shown) of the terminals opposite pin ends 42 can engage contacts of a mating connector at the connection side 48 of headers 12, 14, 16.

In one embodiment, shroud 18, 20, 22 of each header 12, 14, 16 can have two or more alignment or locating pegs 50, 52 (see FIG. 2) for engaging alignment or positioning holes 54, 56 respectively of stamped housing 26 and holes 58, 60, respectively of PCB 28. Pegs 50, 52 can operate to align and locate each header 12, 14, 16 with stamped housing 26 and PCB 28 in the x-axis, y-axis and z-axis. This alignment method can eliminate the need for costly carriers or automation equipment.

FIG. 3 shows an additional advantage of using alignment or positioning pegs 50, 52. As illustrated, alignment holes 54, 56 on the stamped housing 26 are oriented such that they provide a keying feature to the molded shrouds 18, 20, 22. Typically this includes providing a polarized locating or positioning peg position with respect to the stamped housing. Each such peg can be considered as a unique positioning peg. In particular, alignment holes 54, 56 are located varying distances from the bay openings 32, 34, 36. As such, molded shrouds 18, 20, 22 cannot be placed in the wrong bay opening 32, 34, 36 or in an improper orientation as discussed in more detail below. In an alternative embodiment, each header 12, 14, 16 can have pegs 50, 52 with unique cross-sectional shapes and the alignment holes of stamped housing can have corresponding shapes to ensure headers 12, 14, 16 can only be seated in the desired bays 32, 34, 36 and in desired orientation. The corresponding shapes of these alignment holes can advantageously also have a shape that is complementary in size and shape to any such unique cross-sectional shapes of the pegs at locations along the peg that are intended to pass through, and typically also engage, its respective alignment hole.

The positioning pegs 50, 52 and their corresponding alignment holes 54, 56, serve to accurately and precisely position headers 12, 14, 16 relative to housing 26 for later connection with PCB 28 utilizing PCB openings or locating holes 58, 60 and thereby ensure that pin ends 42 properly engage PCB openings 46. In one embodiment, each header 12, 14, 16 can have one or both pegs 50, 52 uniquely positioned on shroud 18, 20, 22, and corresponding alignment holes 54, 56, uniquely positioned on housing 26 to allow each header to be received and properly aligned along the x-axis and the y-axis in only one of bay openings 32, 34, 36 and in only one front to rear orientation. Locating holes 58, 60 of PCB can also be positioned to be aligned with or overlay alignment holes 54, 56 of housing 26. This positioning of headers 12, 14 and 16 can assist in aligning terminals 43 to engage a respective set of PCB openings 46. For example with respect to header 12, the unique positioning of one or both pegs 50, 52 of each header 12, 14, 16 relative to a common reference point and the unique positioning of their corresponding alignment holes 54, 56 of each of the associated bays 32, 34, 36 relative to the same common reference point ensures that header 12 can only be seated in the desired alignment and in the desired bay. In this instance, header 12 can be seated in bay 32 only in the proper front to rear orientation, i.e., each header can only be seated in one direction and will not seat if rotated 180° in the x-y plane. A common reference point between the header and its associated bay can be the center of the header and its respective bay. This provides a keying or polarizing feature that also can include shapes and sizes of the locating holes that generally correspond to a unique cross-sectional shape of the leading portion of the respective pegs. More specifically, the locating holes can advantageously also have a shape and size that is complementary with the size and shape of a corresponding unique cross-sectional shape of the leading portion of the peg which is to accommodate the peg portion.

In the illustrated embodiments, positioning pegs 50, 52 of each header 12, 14, 16 and their corresponding alignment holes 54, 56 can be uniquely positioned to ensure seating of each header 12, 14, 15 in only one of bays 32, 34, 36 and to ensure desired alignment in bays 32, 34, 36 along the x-axis and the y-axis. FIG. 3 shows PCB side 43 of stamped housing 26 and headers 12, 14, 16 seated in bays 32, 34, 36 and pegs 50, 52, engaged with alignment holes 54, 56 respectively. In this illustrated embodiment, the distance between pegs 50, 52 of each header 12, 14, 16 and their respective alignment holes 54, 56 along the x-axis can be different from each other. In particular, distance "A" between pegs 50, 52 of header 12 and their respective alignment holes 54, 56 is different from distance "B" between pegs 50, 52 of header 14 and their respective alignment holes 54, 56 and is different from distance "C" between pegs 50, 52 of header 16 and their respective alignment holes 54, 56. Distance "B" is also different from distance "C".

The same can apply in the y-axis. In other words, the distance between positioning pegs 50, 52 of each header 12, 14, 16 and between their respective alignment holes 54, 56 along the y-axis can be different from each other. In particular, distance "D" between pegs 50, 52 of header 12 and their respective alignment holes 54, 56 is different from distance "E" between pegs 50, 52 of header 14 and their respective alignment holes 54, 56 and is different from distance "F" between pegs 50, 52 of header 16 and their respective alignment holes 54, 56. Distance "E" is also different from distance "F".

The distance between positioning pegs 50, 52 and their respective alignment holes 54, 56 can be varied by altering the position of one or both pegs 50, 52 and their respective alignment holes 54, 56. However, as shown in FIG. 3, peg 50 of each header 12, 14, 16 and its respective alignment hole 54 are aligned along the y-axis and the positions of pegs 52 of each header 12, 14, 16 are varied along both the x-axis and the y-axis. In particular, peg 50 of each header 12, 14, 16 and its respective alignment hole 54 are spaced the same distance "G" along the y-axis and the same distance "H" along the x-axis relative to the same reference point of its respective header and bay opening. One reference point can be the center of the header and bay.

Figure 2:
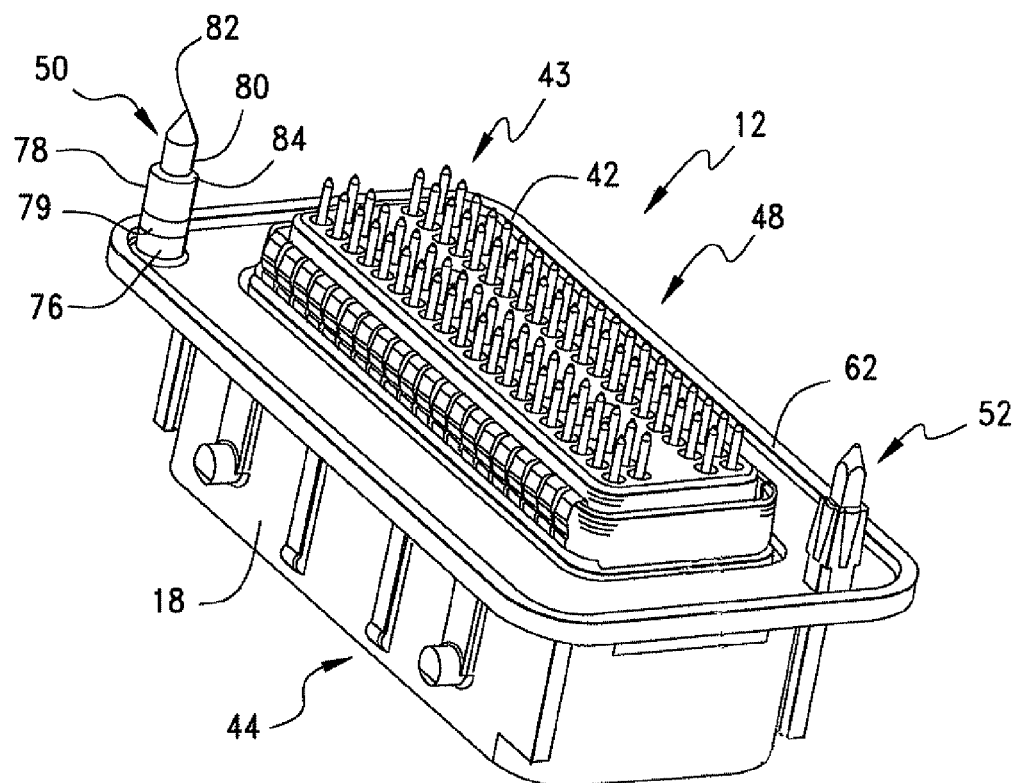
FIG. 2 is a perspective view of a header according to the present disclosure.

It is understood that the following discussion relating to positioning pegs 50, 52 of header 12 shown in FIG. 2 applies equally to pegs 50, 52 of headers 14, 16 unless specifically noted otherwise. As shown in FIG. 2, pegs 50, 52 can extend from connection side 48 of flange portion 62 of shroud 18. While pegs 50, 52 can be positioned anywhere along flange 62, pegs 50, 52 are positioned at opposite corners of flange 62 in the illustrated embodiment. In addition, while pegs 50, 52 can be identical, in the illustrated embodiments, pegs 50, 52 can have different cross-sectional shape.

One or both of alignment or positioning pegs 50, 52 can provide functions in addition to the above described x-axis and y-axis alignment. In particular, one or both positioning pegs 50, 52 can act as a guide for ends of terminals 43 such as pin ends 42 to engage PCB openings 46. In addition, one or both pegs 50, 52 can align pin ends 42 along the z-axis relative to PCB 28 so that pin ends 42 are properly positioned in PCB openings 46. One or both of pegs 50, 52 can secure headers 12, 14, 16 to stamped housing 26 to reduce the risk of movement of the headers 12, 14, 16 while headers 12, 14, 16 undergo a more permanent fixation to housing 26.

Figure 4:
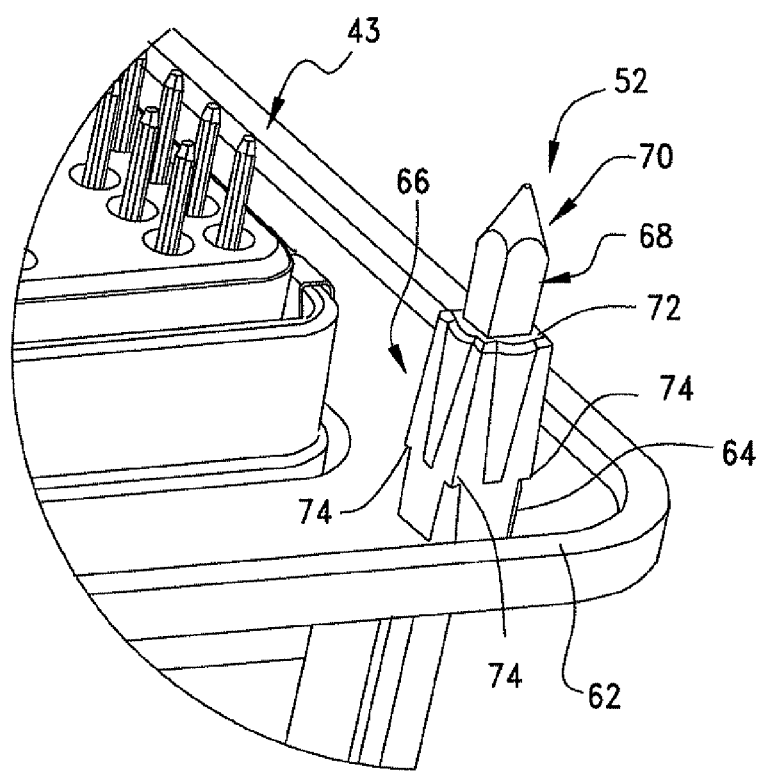
FIG. 4 is a perspective view of one embodiment of an alignment peg according to the present disclosure.

In the embodiment shown in FIG. 4, positioning peg 52 can have a square cross-section and can have base portion 64, a central portion 66, a neck portion 68 and a tapered tip portion 70. Peg 52 can have shoulder 72 at the junction of neck portion 68 and central portion 66 for supporting PCB 28 and for providing a four-point contact with the PCB 28. In the illustrated embodiment, shoulder 72 is formed by the difference in cross-sectional area between neck portion 68 and central portion 66 with neck portion 68 having a lesser cross-sectional area than central portion 66. Central portion 66 can be graded to provide rib protrusions 74 which provide a locking feature in cooperation with flange 62 to retain housing 26 as discussed in more detail below. In particular, central portion can be graded such that the cross-sectional square area increases from shoulder 72 towards base portion 64. Base portion 64 can also be made narrower than central portion 66 and/or have an absence of material adjacent and beneath ribs 74.

Positioning peg 50 can be identical to peg 52 or can have the same general features as peg 52 except for its cross-sectional shape. As shown in FIG. 2, peg 50 can have a circular cross-section but can otherwise have base portion 76, a central portion 78, a neck portion 80 and tapered tip portion 82. Peg 50 can have shoulder 84 at the junction of neck portion 80 and central portion 78 also for supporting PCB 28 and can have a locking rib 79 corresponding to ribs 74. It is understood that shoulder 84 and 72 can be aligned to retain PCB 28 in a level position relative to headers 12, 14, 16.

Figure 5:
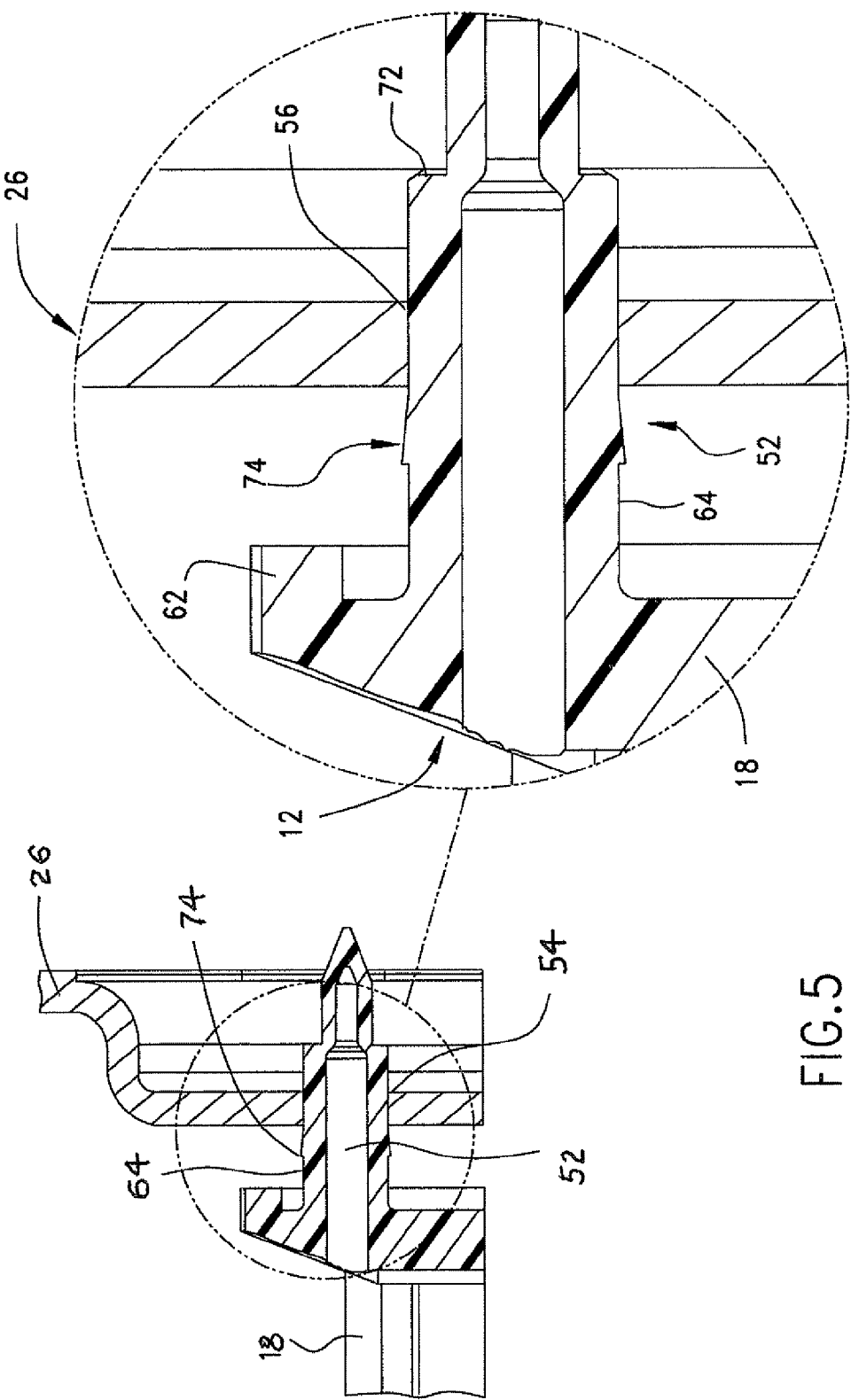
FIG. 5 is a cross-sectional view of one embodiment of an alignment post engaging an alignment hole of a housing in a pre-locked position according to the present disclosure.
Figure 6:
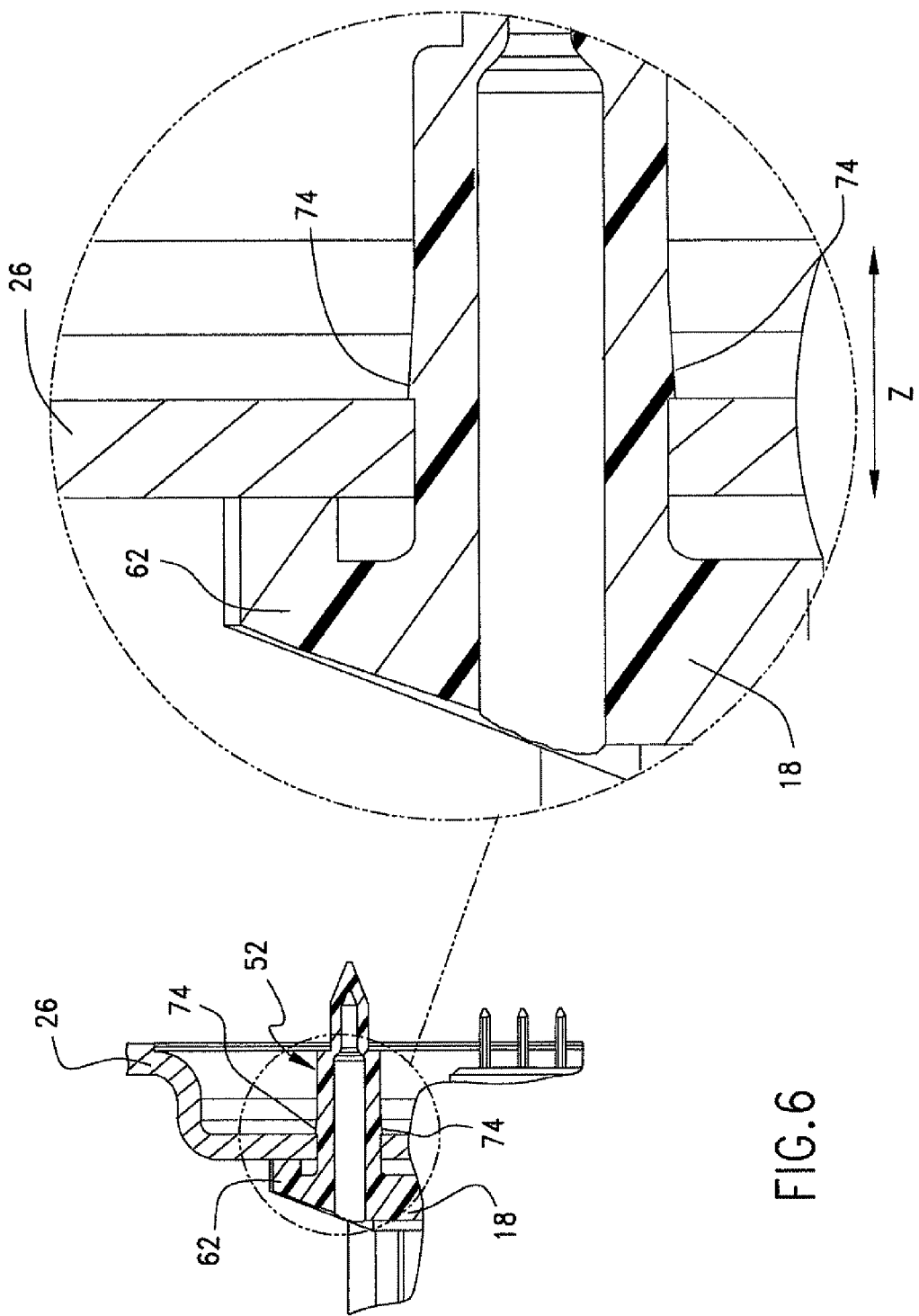
FIG. 6 is a cross-sectional view of one embodiment of an alignment post engaging an alignment hole of a housing in a locked position according to the present disclosure.

The operation of seating header 12 to housing 26 follows with reference to positioning peg 52 and its respective alignment hole 56 as shown in FIG. 5. It is understood that this description also applies with peg 50 of header 12 and its respective alignment hole 54, and that seating of headers 14, 16 proceeds in a similar fashion. As stamped housing 26 and header 12 are brought together, tip portion 70 passes through alignment hole 56 and guides and aligns header 12 to bay 32. Alignment hole 56 can be sized to pass snugly past shoulder 72. As header 12 and stamped housing continue to be brought together and upon reaching ribs 74, stamped housing 26 can cause ribs 74 to deflect inward allowing stamped housing 26 to pass over ribs 74 until housing contacts flange 62 as shown in FIG. 6. Once housing 26 has cleared ribs 74 and settled against flange 62, ribs deflect outward to about their initial or starting position to capture stamped housing 26. Header 12 can now remain in a relatively locked or stationary position as flange 62 and ribs 74 prevent further movement of header 12 relative to housing 26 in the z-axis. The terminals of header 12 can be positioned in shroud 18 such that compliant pin ends 42 are at the desired position to properly engage their PCB holes 46 when header 12 and housing 26 are in this locked position.

PCB 28 can now be joined to header 12 and housing 26. As above, reference will be made to peg 52 of header 12 but it is understood the same applies to the peg 50 of header 12 and to headers 14, 16 generally. Moving to FIG. 7, as PCB 28 and header 12 are brought together tip portion 70 enters its respective alignment hole 60 of PCB prior to pin end 42 entering PCB holes 46, which can be considered a pre-loaded position. This guides the alignment of header 12 to PCB 28 and can reduce or prevent damaging the terminals having pin ends 42, which could otherwise occur with misalignment. In one embodiment, the diamond shape of peg 52 allows normal variation of tolerance due to plastic shrinkage of the header 12, without binding.

Once PCB 28 reaches neck portion 68, pin ends 42 can enter PCB holes 46. Header 12 and PCB 26 can continue to be brought together until PCB 28 contacts shoulder 72. Locating hole 60 can be sized to pass snugly over neck portion 68 but not large enough to pass over shoulder 72. With PCB 28 resting against shoulder 72, pin ends 42 can be properly engaged with PCB holes 46 as shown in FIG. 8 as an illustration of a fully-assembled position.

Besides locking the stamped housing 26 to headers 12, 14, 16 via locking ribs 74 and locking ridge 79, headers 12, 14, 16 can be more securely fixed to stamped housing 26. In one embodiment, headers 12, 14, 16 are fixed to stamped housing 26 using an adhesive such as a silicon adhesive. One advantage in using adhesive is the structural stability that is provided to the header walls through the hardening of the adhesive in the assembled system In one embodiment, flange 62 of header 12 shown in FIGS. 9 and 10 can have lip 86 extending from PCB connection side 48 to form adhesive path 88. One difficulty with using adhesives is to consistently apply the proper amount of adhesive since too little adhesive may not adequately fix header to stamped housing 26 and too much adhesive can result in overflow of the adhesive. To mitigate this issue, the path 88 of the header 12 circumscribes central platform 92 which supports the terminal pins, and this path 88 that is shown in this embodiment also includes a reservoir overflow trough 90. Trough 90 and path 88 can permit any additional adhesive to flow into trough 90 and path 88 when header 12 is mounted to stamped housing 26. Trough 90 and path 88, and especially trough 90, can permit erring on the side of too much adhesive rather than too little. In other words, trough 90 and 88 permit dispensing of slightly more adhesive than is necessary for proper adhesion than dispensing too little while reducing the risk of overflow over lip 86 of flange 62. A user is therefore unable to observe any type of leaking or excessive adhesive flow. While the above trough has been described with reference to header 12, the description is equally applicable to headers 14, 16.

While the present invention has been described in detail with reference to the foregoing embodiments, other changes and modifications may still be made without departing from the spirit or scope of the present invention. It is understood that the present invention is not to be limited by the embodiments described herein. Indeed, the true measure of the scope of the present invention is defined by the appended claims including the full range of equivalents given to each element of each claim.

What is claimed is:

1. A header system comprising:
   a) a system housing including two or more bay openings for receiving an electrical connector and including at least one unique positioning hole associated with each of said bay openings; and
   b) two or more electrical connectors, each electrical connector including a dielectric housing, each electrical connector having at least one unique positioning peg,
   wherein each unique positioning peg is mated with a respective unique positioning hole for mounting each of said two or more electrical connectors to an exclusive one of said two or more bay openings and wherein each of said dielectric housings includes a central platform and a flange having a lip defining an adhesive path circumscribing said central platform and including an adhesive reservoir overflow trough in communication with said adhesive path for receiving an overflow of adhesive during assembly of the header system.

2. The header system of claim 1, wherein each unique positioning peg has a unique cross-sectional shape, said unique cross-sectional shape being complementary to said unique positioning hole.

3. The header system of claim 1, wherein each said unique positioning peg is located at a unique position relative to a common reference point, and said unique positioning hole matches said unique position.

4. The header system of claim 3, wherein each connector includes a unique positioning peg and a second positioning peg, and said system housing includes a unique position hole and a second positioning hole associated with each bay opening.

5. The header system of claim 4, wherein said positioning pegs are located at opposite ends of said dielectric housing, and said positioning holes are located at opposite ends of said of their associated bay opening.

6. The header system of claim 5, wherein said unique positioning peg and second positioning peg of one of said electrical connectors are spaced a first predetermined distance apart along a first axis, and said unique positioning peg and second positioning peg of another of said electrical connectors are spaced a second predetermined distance apart along said first axis, said first and second distances being different from each other.

7. The header system of claim 6, wherein said unique positioning peg and second positioning peg of one of said electrical connectors are spaced a first predetermined distance apart along a second axis, and said unique positioning peg and second positioning peg of another of said electrical connectors are spaced a second predetermined distance apart along said second axis, said first and second distances being different from each other, and said second axis is perpendicular to said first axis.

8. The header system of claim 7, wherein each of said electrical connectors includes terminal pins for engaging respective openings on a PCB, each of said unique positioning pegs and second positioning pegs includes a tapered tip portion extending beyond said terminal pins for guiding said terminal pins for engagement with respective terminal pin openings of said PCB.

9. The header system of claim 7, wherein each of said unique positioning pegs and said second positioning pegs includes a rib, said ribs and flange of each electrical connector cooperate to capture said system housing.

10. An electrical connector header system for mounting on a housing having a plurality of bays bay openings for receiving electrical connectors, each bay opening being adjacent to at least one unique positioning hole of the housing, the connector system comprising:
    a) a plurality of headers, each header having a mating side and a connection side, each header carrying an array of pins extending outward from the mating side; and
    b) a plurality of positioning pegs extending outward from the mating side of each header, the pegs extend outward from the header by a distance greater than the array of pins extend outward from the mating side, at least one of said positioning pegs is a unique positioning peg adapted for mating with only one of the at least one unique positioning hole of the housing;
    wherein said mating of said unique positioning peg with only one of the at least one unique positioning holes ensures mounting of each respective header in only a predetermined one of the bay openings;
    each said unique positioning peg has a unique position on its header relative to a common reference point of its header, and said unique position is in alignment with the respective unique positioning hole of the housing to ensure mounting along both the x-axis and the y-axis that corresponds to x-axis and y-axis locations of only the predetermined bay opening; and each of said headers has a central platform and an adhesive path circumscribing the central platform and a flange having a lip, the flange and lip including an adhesive reservoir overflow trough in fluid communication with the adhesive path for receiving an overflow of adhesive during assembly of the system.

* * * * *